(12) United States Patent
Kister

(10) Patent No.: US 7,944,224 B2
(45) Date of Patent: *May 17, 2011

(54) LOW PROFILE PROBE HAVING IMPROVED MECHANICAL SCRUB AND REDUCED CONTACT INDUCTANCE

(75) Inventor: January Kister, Portola Valley, CA (US)

(73) Assignee: MicroProbe, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/684,272

(22) Filed: Jan. 8, 2010

(65) Prior Publication Data

US 2010/0109691 A1    May 6, 2010

Related U.S. Application Data (63) Continuation of application No. 11/635,809, filed on Dec. 6, 2006, now Pat. No. 7,649,367.

(60) Provisional application No. 60/748,438, filed on Dec. 7, 2005.

(51) Int. Cl.
  *G01R 31/20* (2006.01)
  *G01R 31/067* (2006.01)

(52) U.S. Cl. ......... 324/754.01; 324/754.03; 324/754.12; 324/754.14; 324/755.01; 324/755.07

(58) Field of Classification Search .................. None
See application file for complete search history.

(56) References Cited

U.S. PATENT DOCUMENTS

| 3,518,612 | A | 6/1970 | Dunman et al. |
|---|---|---|---|
| 3,599,093 | A | 8/1971 | Oates |
| 3,710,251 | A | 1/1973 | Hagge et al. |
| 3,812,311 | A | 5/1974 | Kvaternik |
| 4,027,935 | A | 6/1977 | Byrnes et al. |
| 4,115,736 | A | 9/1978 | Tracy |
| 4,116,523 | A | 9/1978 | Coberly et al. |

(Continued)

FOREIGN PATENT DOCUMENTS

DE    4237591 A    5/1994

(Continued)

OTHER PUBLICATIONS

Sporck, Nicholas, "A New Probe Card Technology Using Compliant Microsprings", *Proceedings 1997 IEEE International Test Conference* Nov. 1, 1997, pp. 527-532.

(Continued)

*Primary Examiner* — Vinh P Nguyen
(74) *Attorney, Agent, or Firm* — Deborah A. Peacock; Samantha A. Updegraff; Peacock Myers, P.C.

(57) ABSTRACT

A vertically folded probe is provided that can provide improved scrub performance in cases where the probe height is limited. More specifically, such a probe includes a base and a tip, and an arm extending from the base to the tip as a single continuous member. The probe arm is vertically folded, such that it includes three or more vertical arm portions. The vertical arm portions have substantial vertical overlap, and are laterally displaced from each other. When such a probe is vertically brought down onto a device under test, the probe deforms. During probe deformation, at least two of the vertical arm portions come into contact with each other. Such contact between the arm portions can advantageously increase the lateral scrub motion at the probe tip, and can also advantageously reduce the probe inductance.

66 Claims, 5 Drawing Sheets

U.S. PATENT DOCUMENTS

| | | | |
|---|---|---|---|
| 4,423,376 A | 12/1983 | Byrnes et al. | |
| 4,525,697 A | 6/1985 | Jones et al. | |
| 4,532,423 A | 7/1985 | Tojo et al. | |
| 4,567,433 A | 1/1986 | Ohkubo et al. | |
| 4,593,961 A | 6/1986 | Cosmo | |
| 4,618,767 A | 10/1986 | Smith et al. | |
| 4,618,821 A | 10/1986 | Lenz | |
| 4,706,019 A | 11/1987 | Richardson | |
| 4,730,158 A | 3/1988 | Kasai et al. | |
| 4,747,698 A | 5/1988 | Wickramasinghe et al. | |
| 4,757,255 A | 7/1988 | Margozzi | |
| 4,772,846 A | 9/1988 | Reeds | |
| 4,773,877 A | 9/1988 | Kruger et al. | |
| 4,807,159 A | 2/1989 | Komatsu et al. | |
| 4,901,013 A | 2/1990 | Benedetto et al. | |
| 4,967,148 A | 10/1990 | Doemens et al. | |
| 5,015,947 A | 5/1991 | Chism | |
| 5,026,291 A | 6/1991 | David | |
| 5,030,318 A | 7/1991 | Reche | |
| 5,061,192 A | 10/1991 | Chapin et al. | |
| 5,067,007 A | 11/1991 | Otsuka et al. | |
| 5,145,384 A | 9/1992 | Asakawa et al. | |
| 5,205,739 A | 4/1993 | Malo et al. | |
| 5,207,585 A | 5/1993 | Byrnes | |
| 5,225,771 A | 7/1993 | Leedy | |
| 5,230,632 A | 7/1993 | Baumberger et al. | |
| 5,237,743 A | 8/1993 | Busacco et al. | |
| 5,354,205 A | 10/1994 | Feigenbaum et al. | |
| 5,399,982 A | 3/1995 | Driller | |
| 5,422,574 A | 6/1995 | Kister | |
| 5,430,614 A | 7/1995 | Difrancesco | |
| 5,436,571 A | 7/1995 | Karasawa | |
| 5,476,211 A | 12/1995 | Khandros | |
| 5,531,022 A | 7/1996 | Beaman et al. | |
| 5,576,631 A | 11/1996 | Stowers et al. | |
| 5,632,631 A | 5/1997 | Fjelstad et al. | |
| 5,635,846 A | 6/1997 | Beaman et al. | |
| 5,644,249 A | 7/1997 | Kister | |
| 5,676,599 A | 10/1997 | Ricks et al. | |
| 5,720,098 A | 2/1998 | Kister | |
| 5,742,174 A | 4/1998 | Kister et al. | |
| 5,751,157 A | 5/1998 | Kister | |
| 5,764,070 A | 6/1998 | Pedder | |
| 5,764,072 A | 6/1998 | Kister | |
| 5,764,409 A | 6/1998 | Colvin | |
| 5,767,691 A | 6/1998 | Verkuil | |
| 5,772,451 A | 6/1998 | Dozier, II et al. | |
| 5,773,987 A | 6/1998 | Montoya | |
| 5,802,699 A | 9/1998 | Fjelstad et al. | |
| 5,806,181 A | 9/1998 | Khandros et al. | |
| 5,821,763 A | 10/1998 | Beamann et al. | |
| 5,829,128 A | 11/1998 | Eldridge et al. | |
| 5,832,601 A | 11/1998 | Eldridge et al. | |
| 5,852,871 A | 12/1998 | Khandros | |
| 5,864,946 A | 2/1999 | Eldridge et al. | |
| 5,884,395 A | 3/1999 | Dabrowiecki et al. | |
| 5,892,539 A | 4/1999 | Colvin | |
| 5,914,613 A | 6/1999 | Gleason et al. | |
| 5,917,707 A | 6/1999 | Khandros et al. | |
| 5,923,178 A | 7/1999 | Higgins et al. | |
| 5,926,951 A | 7/1999 | Khandros et al. | |
| 5,932,323 A | 8/1999 | Throssel | |
| 5,934,914 A | 8/1999 | Fjelstad et al. | |
| 5,936,421 A | 8/1999 | Stowers et al. | |
| 5,945,836 A | 8/1999 | Sayre et al. | |
| 5,952,843 A | 9/1999 | Vinh | |
| 5,969,533 A | 10/1999 | Takagi | |
| 5,970,167 A | 10/1999 | Colvin | |
| 5,974,662 A | 11/1999 | Eldridge et al. | |
| 5,994,152 A | 11/1999 | Khandros et al. | |
| 6,027,630 A | 2/2000 | Cohen | |
| 6,029,344 A | 2/2000 | Khandros et al. | |
| 6,031,282 A | 2/2000 | Jones et al. | |
| 6,064,215 A | 5/2000 | Kister | |
| 6,066,957 A | 5/2000 | Van Loan et al. | |
| 6,071,630 A | 6/2000 | Tomaru et al. | |
| 6,086,386 A | 7/2000 | Fjelstad et al. | |
| 6,133,072 A | 10/2000 | Fjelstad | |
| 6,184,576 B1 | 2/2001 | Jones et al. | |
| 6,204,674 B1 | 3/2001 | Dabrowiecki et al. | |
| 6,205,660 B1 | 3/2001 | Fjelstad et al. | |
| 6,215,320 B1 | 4/2001 | Parrish | |
| 6,218,203 B1 | 4/2001 | Khoury et al. | |
| 6,246,245 B1 | 6/2001 | Akram et al. | |
| 6,246,247 B1 | 6/2001 | Eldridge et al. | |
| 6,247,228 B1 | 6/2001 | Distefano et al. | |
| 6,255,126 B1 | 7/2001 | Mathieu et al. | |
| 6,259,261 B1 | 7/2001 | Engelking et al. | |
| 6,278,284 B1 | 8/2001 | Mori et al. | |
| 6,292,003 B1 | 9/2001 | Fredrickson et al. | |
| 6,334,247 B1 | 1/2002 | Beaman et al. | |
| 6,336,269 B1 | 1/2002 | Eldridge et al. | |
| 6,344,753 B1 | 2/2002 | Takada et al. | |
| 6,411,112 B1 | 6/2002 | Das et al. | |
| 6,419,500 B1 | 7/2002 | Kister | |
| 6,420,887 B1 | 7/2002 | Kister et al. | |
| 6,424,164 B1 | 7/2002 | Kister | |
| 6,433,571 B1 | 8/2002 | Montoya | |
| 6,437,584 B1 | 8/2002 | Gleason et al. | |
| 6,441,315 B1 | 8/2002 | Eldridge et al. | |
| 6,443,784 B1 | 9/2002 | Kimoto | |
| 6,482,013 B2 | 11/2002 | Eldridge et al. | |
| 6,486,689 B1 | 11/2002 | Nishikawa | |
| 6,525,552 B2 | 2/2003 | Kister | |
| 6,529,021 B1 | 3/2003 | Yu et al. | |
| 6,530,148 B1 | 3/2003 | Kister | |
| 6,566,898 B2 | 5/2003 | Theissen et al. | |
| 6,570,396 B1 | 5/2003 | Kister | |
| 6,573,738 B1 | 6/2003 | Matsuo et al. | |
| 6,575,767 B2 | 6/2003 | Satoh et al. | |
| 6,576,485 B2 | 6/2003 | Zhou et al. | |
| 6,586,955 B2 | 7/2003 | Fjelstad et al. | |
| 6,615,485 B2 | 9/2003 | Eldridge et al. | |
| 6,624,648 B2 | 9/2003 | Eldridge et al. | |
| 6,633,176 B2 | 10/2003 | Takemoto et al. | |
| 6,641,430 B2 | 11/2003 | Zhou et al. | |
| 6,646,455 B2 | 11/2003 | Maekawa et al. | |
| 6,676,438 B2 | 1/2004 | Zhou et al. | |
| 6,677,245 B2 | 1/2004 | Zhou et al. | |
| 6,707,311 B2 | 3/2004 | Hohenwarter | |
| 6,727,719 B2 | 4/2004 | Liao et al. | |
| 6,731,123 B2 | 5/2004 | Kimoto | |
| 6,765,228 B2 | 7/2004 | Lin et al. | |
| 6,825,422 B2 | 11/2004 | Eldridge et al. | |
| 6,842,023 B2 | 1/2005 | Yoshida et al. | |
| 6,847,221 B2 | 1/2005 | Kimoto et al. | |
| 6,853,208 B2 | 2/2005 | Okubo et al. | |
| 6,881,974 B2 | 4/2005 | Wood et al. | |
| 6,890,185 B1 * | 5/2005 | Kister et al. | 439/66 |
| 6,897,666 B2 | 5/2005 | Swettlen et al. | |
| D507,198 S | 7/2005 | Kister | |
| 6,917,102 B2 | 7/2005 | Zhou et al. | |
| 6,917,525 B2 | 7/2005 | Mok et al. | |
| D510,043 S | 9/2005 | Kister | |
| 6,956,389 B1 | 10/2005 | Mai | |
| 6,965,244 B2 | 11/2005 | Miller | |
| 6,965,245 B2 | 11/2005 | Kister et al. | |
| 6,970,005 B2 | 11/2005 | Rincon et al. | |
| 7,015,707 B2 | 3/2006 | Cherian | |
| 7,046,021 B2 | 5/2006 | Kister | |
| 7,059,865 B2 | 6/2006 | Kister et al. | |
| 7,064,564 B2 | 6/2006 | Kister et al. | |
| D525,207 S | 7/2006 | Kister et al. | |
| 7,071,715 B2 | 7/2006 | Shinde et al. | |
| 7,073,254 B2 | 7/2006 | Eldridge et al. | |
| 7,078,921 B2 | 7/2006 | Haga et al. | |
| 7,088,118 B2 | 8/2006 | Liu et al. | |
| 7,091,729 B2 | 8/2006 | Kister | |
| 7,109,731 B2 | 9/2006 | Gleason et al. | |
| 7,148,709 B2 | 12/2006 | Kister | |
| 7,150,658 B1 | 12/2006 | Chien | |
| 7,173,441 B2 | 2/2007 | Kister et al. | |
| 7,189,078 B2 | 3/2007 | Kister et al. | |
| 7,202,682 B2 | 4/2007 | Cooper et al. | |
| 7,217,138 B2 | 5/2007 | Kister et al. | |
| 7,218,127 B2 | 5/2007 | Cooper et al. | |
| 7,218,131 B2 | 5/2007 | Tanioka et al. | |

| | | |
|---|---|---|
| 7,225,538 B2 | 6/2007 | Eldridge et al. |
| 7,227,371 B2 | 6/2007 | Miller |
| 7,265,565 B2 | 9/2007 | Chen et al. |
| 7,274,195 B2 | 9/2007 | Takemoto et al. |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 2001/0012739 A1 | 8/2001 | Grube et al. |
| 2001/0040460 A1 | 11/2001 | Beaman et al. |
| 2002/0070743 A1 | 6/2002 | Felici et al. |
| 2002/0153913 A1 | 10/2002 | Okubo et al. |
| 2002/0194730 A1 | 12/2002 | Shih et al. |
| 2003/0027423 A1 | 2/2003 | Zhou et al. |
| 2003/0116346 A1 | 6/2003 | Forster et al. |
| 2004/0036493 A1 | 2/2004 | Miller |
| 2004/0104737 A1 | 6/2004 | Haga et al. |
| 2004/0119485 A1 | 6/2004 | Koch et al. |
| 2004/0239352 A1 | 12/2004 | Mizoguchi |
| 2005/0179458 A1 | 8/2005 | Chen et al. |
| 2005/0189955 A1 | 9/2005 | Takemoto et al. |
| 2005/0189958 A1 | 9/2005 | Chen et al. |
| 2006/0033516 A1 | 2/2006 | Rincon et al. |
| 2006/0073712 A1 | 4/2006 | Suhir |
| 2006/0082380 A1 | 4/2006 | Tanioka et al. |
| 2006/0170440 A1 | 8/2006 | Sudin |
| 2006/0171425 A1 | 8/2006 | Lee et al. |
| 2007/0167022 A1 | 7/2007 | Tsai et al. |
| 2008/0074132 A1 | 3/2008 | Fan et al. |

FOREIGN PATENT DOCUMENTS

| | | |
|---|---|---|
| JP | 63-307678 | 12/1988 |
| JP | 7-021968 | 1/1995 |
| JP | 7-333232 | 12/1995 |
| JP | 10-506238 | 6/1998 |
| JP | 10-221374 | 8/1998 |
| JP | 11241690 | 9/1999 |
| WO | WO 8704568 | 7/1987 |
| WO | WO92/10010 | 6/1992 |
| WO | WO 96/15458 | 5/1996 |
| WO | WO96/37332 | 11/1996 |
| WO | WO97/43653 | 11/1997 |
| WO | WO01/09623 | 2/2001 |

OTHER PUBLICATIONS

Sporck, Nicholas, "A New Probe Card Technology Using Compliant Microsprings", *Proceedings 1997 IEEE International Test Conference* Nov. 1, 1997, 527-532.

Levy, Larry, "Water Probe TM System", *Southwest Workshop* formfactor inc. Jun. 1997, 1-19.

* cited by examiner

LOW PROFILE PROBE HAVING IMPROVED MECHANICAL SCRUB AND REDUCED CONTACT INDUCTANCE

CROSS-REFERENCE TO RELATED APPLICATIONS

This application is a continuation application of U.S. patent application Ser. No. 11/635,809, entitled "Low Profile Probe Having Improved Mechanical Scrub and Reduced Contact Inductance", to January Kister, filed on Dec. 6, 2006, which claimed priority to and the benefit of the filing of U.S. provisional application 60/748,438, entitled "Micro-Fabricated Low Profile Probe", to January Kister, filed on Dec. 7, 2005, and the specifications and claims of all the applications listed above are incorporated herein by reference.

BACKGROUND OF THE INVENTION

1. Field of the Invention (Technical Field) test (DUT).
The present invention relates to probes for making electrical contact to a device under
2. Description of Related Art
Probes for making electrical contact to a device under test (DUT) are typically resilient devices that deform in a controllable manner in use. Probe deformation can perform various functions, such as providing a suitable scrub motion between probe tip and contact pad to facilitate making a reliable electrical contact. The shape of a probe has a significant effect on its deformation properties, and accordingly many kind of probe shapes have been considered in the art. Representative examples of known probe shapes include U.S. Pat. No. 6,707,311, U.S. Pat. No. 6,482,013, U.S. Pat. No. 6,278,284, U.S. Pat. No. 5,832,601, U.S. Pat. No. 6,956,389, U.S. Pat. No. 6,677,245, and US 2003/0027423.

Various probe fabrication methods have been employed to make such probes. One of these methods is referred to as micro-fabrication, and entails building up a probe (or probe array) by deposition of appropriately patterned layers having probe material and sacrificial material, such that eventual removal of the sacrificial material exposes the fabricated probe(s). Micro-fabrication approaches typically impose an overall height limit on the fabricated probe. A typical height limit for micro-fabrication is on the order of 0.8 mm. The existence of some such limit is unsurprising, since deposition of an unlimited number of layers is unlikely to be practical.

Probes provided by micro-fabrication have been considered in the art, Examples include the probes of US 2005/0189958, U.S. Pat. No. 6,917,525, U.S. Pat. No. 6,218,203, and U.S. Pat. No. 6,027,630, where several zigzag and folded probe geometries are considered. Many of these probe designs can be regarded as a scaling of known probe geometries to comply with the vertical height limit of probe micro-fabrication.

However, we have found that such scaling of known probe geometries to comply with the height limit of probe micro-fabrication tends to provide probes having unfavorable performance characteristics. In particular, it is difficult to obtain sufficient lateral scrub motion from conventional probe geometries scaled to comply with a height limit on the order of 0.8 mm.

Accordingly, it would be an advance in the art to provide a probe geometry for providing improved lateral scrub motion while complying with a vertical height limit.

BRIEF SUMMARY OF EMBODIMENTS OF THE PRESENT INVENTION

According to the invention, a vertically folded probe can provide improved scrub performance in cases where the probe height is limited. More specifically, such a probe includes a base and a tip, and an arm extending from the base to the tip as a single continuous member. The probe arm is vertically folded, such that it includes three or more vertical arm portions. The vertical arm portions have substantial vertical overlap, and are laterally displaced from each other. When such a probe is vertically brought down onto a device under test, the probe deforms. During probe deformation, at least two of the vertical arm portions come into contact with each other. Such contact between the arm portions can advantageously increase the lateral scrub motion at the probe tip, and can also advantageously reduce the probe inductance Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1A:
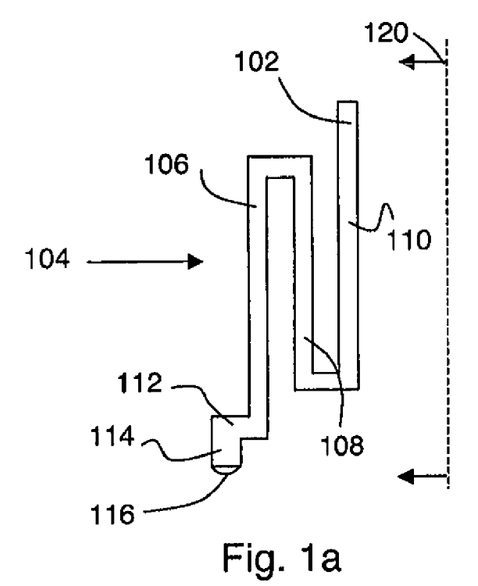
FIGS. 1a-b show two views of a probe according to an embodiment of the invention.
Figure 1B:
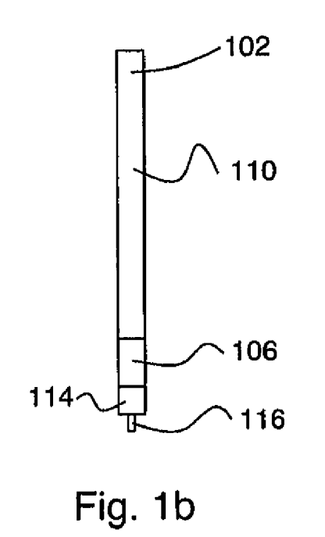

FIGS. 1a-b show two views of a probe according to an embodiment of the invention. The probe includes a probe base 102, a probe tip 114, and an arm 104 extending from probe base 102 to probe tip 114 as a continuous member. Arm 104 includes three or more vertical arm portions, which in this example are labeled as 106, 108, and 110. The vertical arm portions are substantially parallel to a direction of relative motion between probe and DUT as contact is made. The vertical arm portions are laterally displaced from each other, as shown. Finally, the vertical arm portions have a substantial vertical overlap with each other, also as shown. The net effect of these geometrical constraints is to ensure that arm 104 is folded vertically from base 102 to tip 114, as opposed to being folded horizontally between base 102 and tip 114. FIG. 1b shows a view of the probe of FIG. 1a as seen from view 120.

Optionally, probe arm 104 can include a lateral termination 112, on which probe tip 114 is located. Also optionally, probe tip 114 can include a reduced width protrusion 116 to facilitate making electrical contact.

Figure 2A:
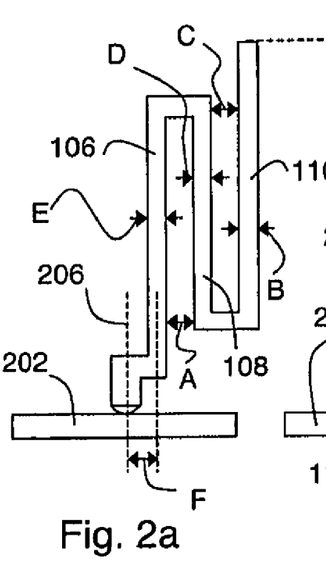
FIGS. 2a-c show a probe according to an embodiment of the invention in various deformation conditions.
Figures 2B, 2C:
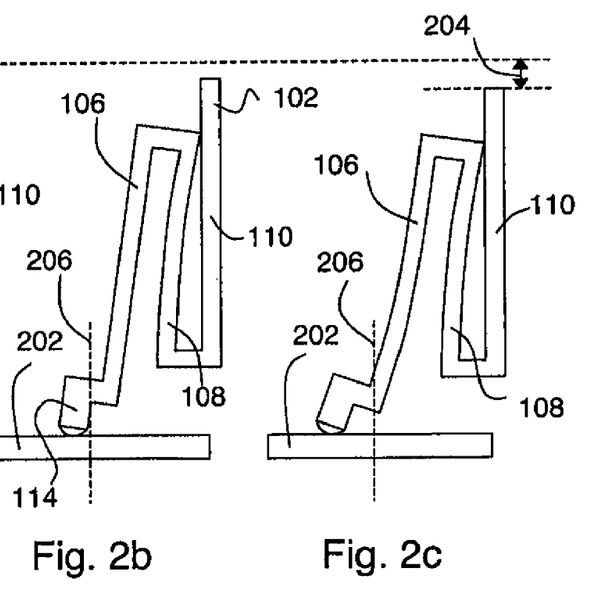

FIGS. 2*a-c* show a probe according to an embodiment of the invention in various deformation conditions. FIG. 2*a* shows an initial contact configuration when the probe first makes contact to a contact pad (or bump) 202. Throughout this description, "vertical" refers to the direction of relative motion between contact pad 202 and probe base 102 as contact is made. Dashed line 206 shows this direction on FIGS. 2*a-c*, and it is also apparent that vertical arm portions 106, 108, and 110 are parallel to dashed line 206 in the undeformed state of FIG. 2*a*. Once initial contact is made, the contact pad and probe base are brought closer to each other by a predetermined vertical distance referred to as the overtravel 204. The resulting probe motion and deformation is conveniently referred to as contact motion. For any particular probe design, there is a one-to-one relation between overtravel and contact force (which may be linear or nonlinear), so either parameter can be used to quantify the contact motion.

In the initial stages of the contact motion, gap C becomes narrower as the contact motion proceeds, and eventually vertical arm portions 108 and 110 make contact as shown on FIG. 2*b*. During this phase of the contact motion, the probe tip mainly rocks on the contact pad, with relatively little lateral displacement, as shown on FIG. 2*b*. Once gap C is closed, gap A increases as the contact motion proceeds. During this phase of the contact motion, the probe tip continues to rock, and has relatively large lateral displacement, as shown on FIG. 2*c*. On FIGS. 2*a-c*, vertical line 206 is laterally positioned at the point of first contact between the probe and contact pad 202, so motion of the probe tip away from line 206 is a lateral scrub motion.

This specific probe deformation can provide significant advantages. A first advantage is that a relatively large lateral scrub motion can be achieved in a probe configuration having a relatively small total vertical height. It is important that the scrub motion be sufficient to effectively remove oxide and other impediments to reliable electrical contact. In one design example, a lateral scrub of 50 μm or more was achieved with a probe configuration having a total height on the order of 0.8 mm (i.e., consistent with a typical micro-fabrication height limit). The total length of the vertically folded probe arm in this example was 1.5 mm.

A second advantage is that the contact formed between vertical arm portions 108 and 110 on FIGS. 2*b-c* can provide a current path from probe base 102 to probe tip 114 having reduced inductance. Reducing the inductance of the probe advantageously improves the AC bandwidth and current carrying capability.

The amount of lateral scrub provided by the probe of FIGS. 2*a-c* can be altered by varying the probe geometry. For example, increasing gap C tends to decrease the lateral scrub motion. Scrub motion tends to increase as the lateral separation between probe tip 114 and probe base 102 increases. Gaps A and C can be varied to set the lateral offset, and the lateral termination length F, if a lateral termination 112 is present, can also be varied to set the lateral offset. The beam thicknesses B, D, and E determine the contact force for a given probe geometry and overtravel distance. Typical parameter working ranges are as follows: A and C from about 25 μm to about 100 μm; B, D, and E from about 25 μm to about 150 μm; and F from about 25 μm to about 50 μm. Typical contact forces are about 2 grams (force) or greater. Typical vertical overtravels are about 40 μm or greater, and preferably are about 50 μm or greater. It is also preferred for the probe thickness perpendicular to the probe plane to be somewhat higher than the nominal in-plane probe thickness, so that deformation of the probe is easiest in the probe plane. More specifically, the out of plane thickness is preferably between about 1.1 $h_{nom}$ and about 1.5 $h_{nom}$, where $h_{nom}$ is a nominal in-plane probe thickness, and is typically equal or approximately equal to B, D, and E.

Probes according to the invention can be fabricated from any mechanically resilient and electrically conductive material. Suitable materials for probe base 102, probe arm 104 and probe tip 114 are well known in the art, and any such materials can be employed in practicing the invention. Suitable tip materials are electrically conductive and wear-resistant, and include Rh and Cr. As indicated above, the invention can be especially advantageous in connection with micro-fabrication, but probes according to the invention can be fabricated via any probe fabrication method. Suitable methods include, but are not limited to, standard multi-layer metal deposition techniques such as plating and sputtering; photolithographic techniques; micro-fabrication and microelectromechanical systems (MEMS) techniques.

Figure 3A:
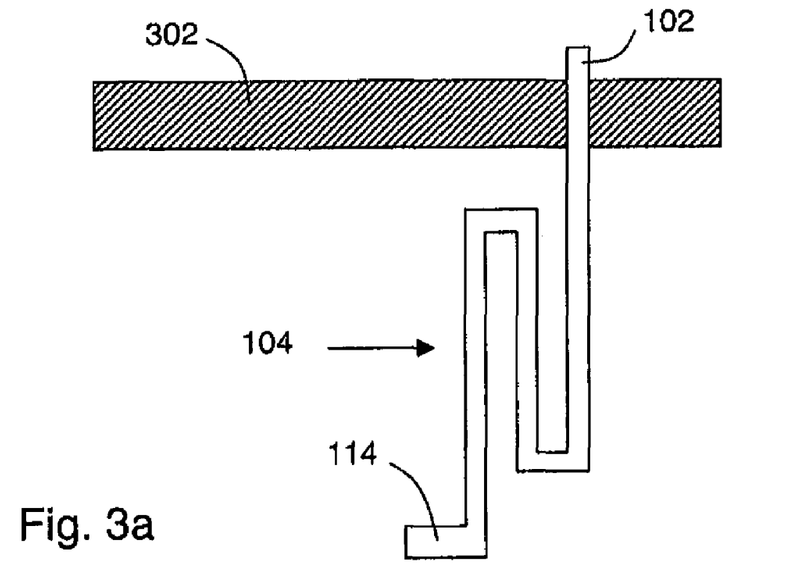
FIGS. 3a-b show two exemplary options for mounting probes according to an embodiment of the invention.
Figure 3B:
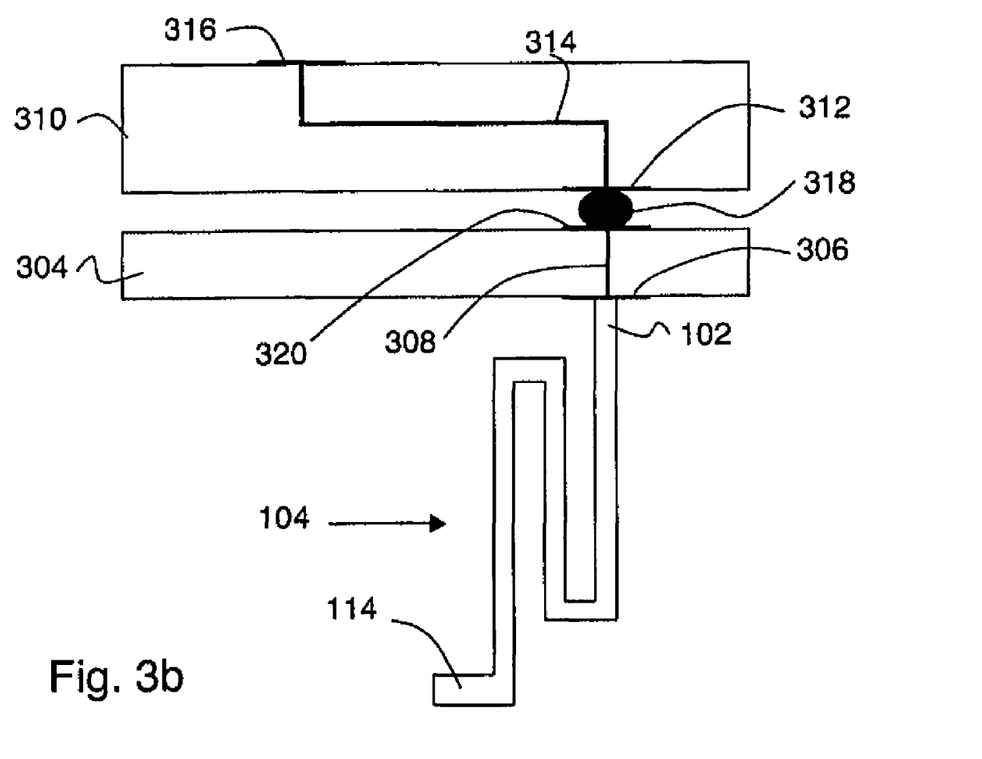

FIGS. 3*a-b* show two exemplary options for mounting probes according to an embodiment of the invention. FIG. 3*a* shows a mounting arrangement where probe base 102 is held in a clamping plate or fixture 302. FIG. 3*b* shows a mounting arrangement suitable for use in connection with micro-fabricated probes. In this example, the probe (including probe base 102, probe arm 104 and probe tip 114) is plated up from a metallized pad 306 on a ceramic carrier 304. The probe-to-pad and pad-to-carrier junctions have high mechanical strength. A via 308 passes through carrier 304 and connects contact pad 306 to another contact pad 308. An assembly of one or more probes on carrier 304 can be connected to a space transformer 310 via solder bumps such as 318. The space transformer 310 provides vias such as 314 connecting input pads such as 312 to output pads such as 316. The use of a space transformer 310 to facilitate making electrical contact to densely packed arrays of probes is well known in the art.

A key point of this example is that the mechanical stresses arising from probe deformation do not reach solder bump 318, which tends to be mechanically weak. Instead, these stresses reach the junction between probe base 102 and pad 306 and the junction between pad 306 and carrier 304, and both junctions can have mechanical strength comparable to that of the probe itself. By ensuring that mechanical stress from probe deformation does not reach the solder bumps, mechanical reliability can be improved.

Figure 4:
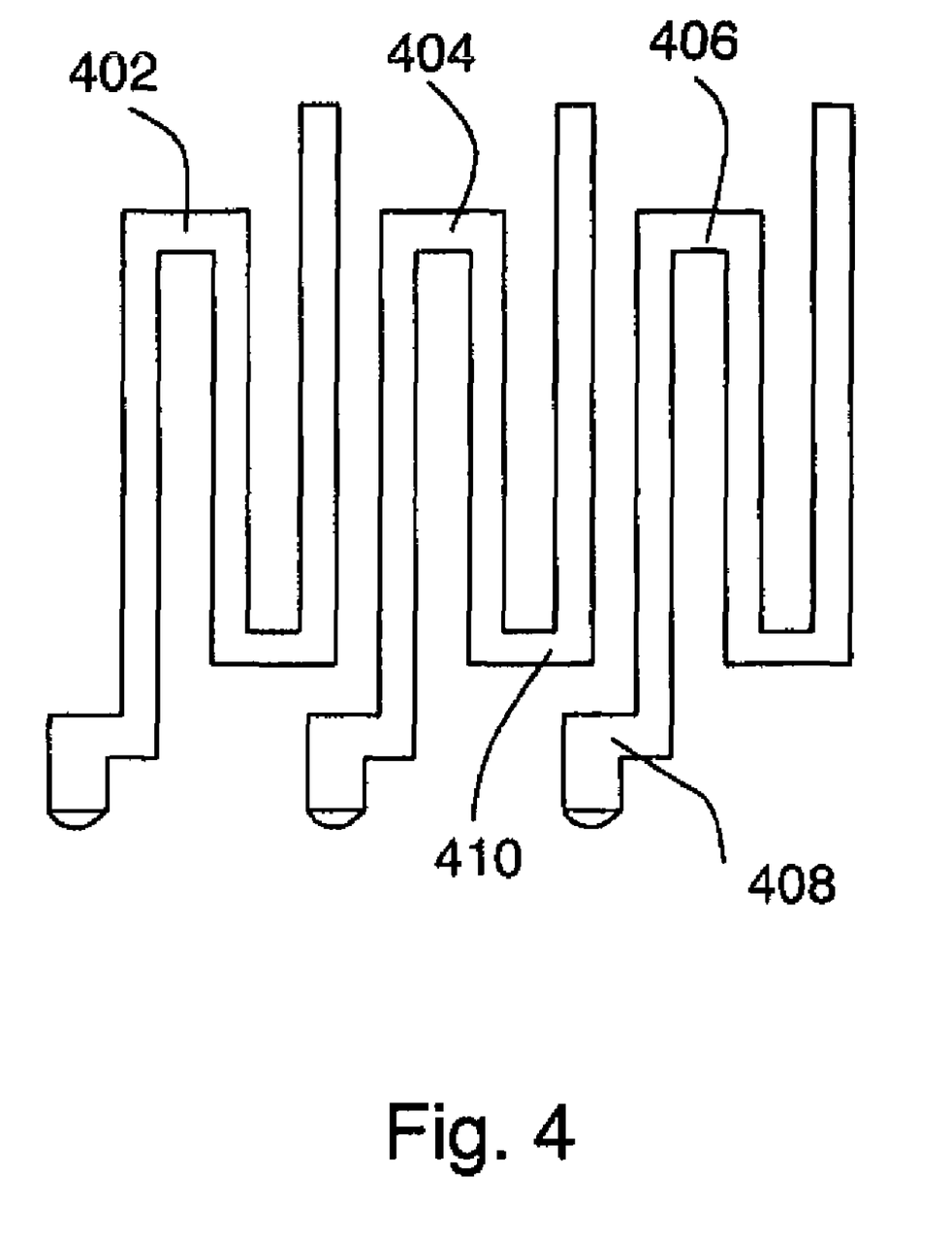
FIG. 4 shows an embodiment of the invention having multiple overlapping probes.

FIG. 4 shows an embodiment of the invention having multiple overlapping probes, 402, 404, and 406. As indicated above, probe arrays are commonly employed in practice, and it is often necessary to minimize the separation between probes, e.g., in order to probe densely packed arrays of contact pads. In embodiments of the invention where a lateral termination at the probe tip is employed to provide an additional lateral offset at the probe tip (e.g., as shown on FIGS. 1*a-b* and 2*a-c*), the probes of a probe array can overlap as shown on FIG. 4. More specifically, the lateral termination 408 of a first probe 406 can fit under a portion of the arm 410 of a second probe 404. In a probe array, it is important to ensure that no two probes come into contact with each other as each probe performs its contact motion, e.g., by providing adequate separation between probes.

Figure 5A:
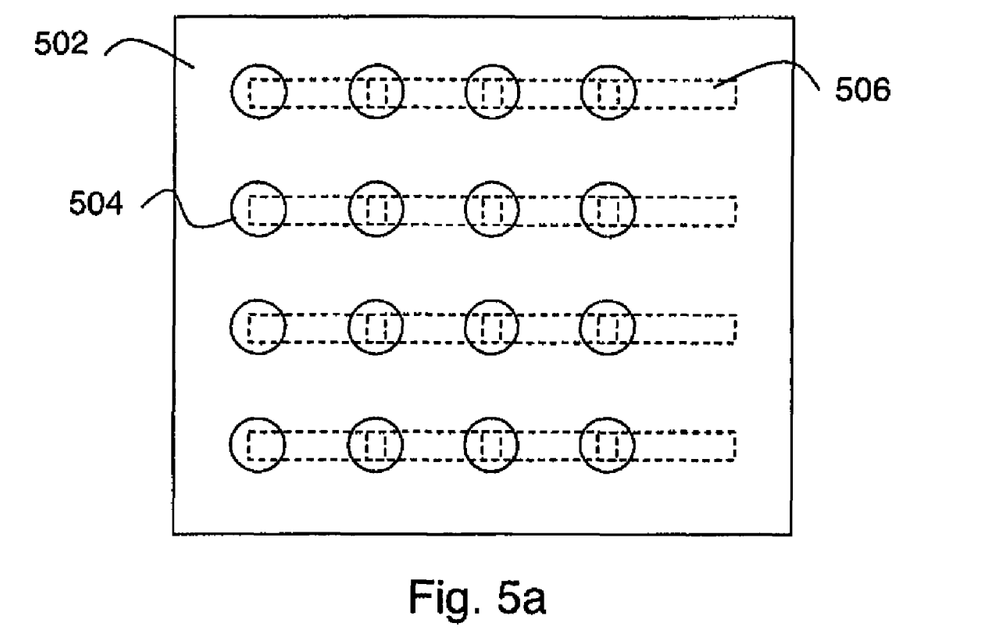
FIGS. 5a-b show embodiments of the invention having probes orthogonally and diagonally aligned with respect to an array of contact pads.
Figure 5B:
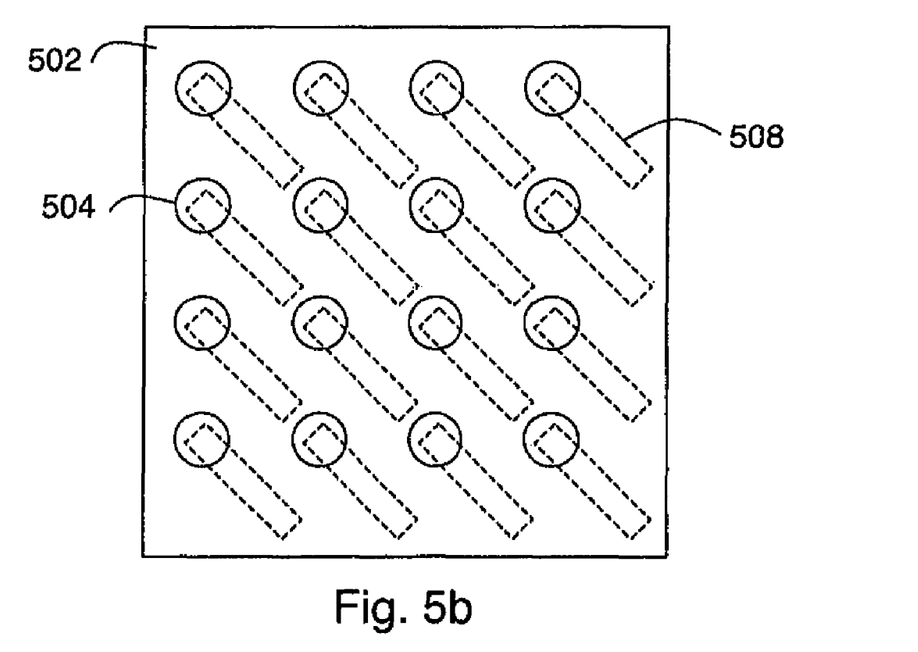

FIGS. 5*a-b* show embodiments of the invention having probes orthogonally and diagonally aligned with respect to an array of contact pads. FIGS. 5*a-b* are top views of a DUT 502 having an array of contact bumps, one of which is referenced as 504. From the top, probes as in the previously described embodiments of the invention (i.e., substantially planar probes) have a rectangular outline. On FIG. 5*a*, an array of probes, one of which is referenced as 506, corresponds to the array of contact bumps. In this example, the probes are aligned orthogonally with respect to the contact bump array. The probes in this example are shown as overlapping, and contact between probes can be avoided by employing the kind of probe overlap shown on FIG. 4.

In cases where a dense array of contact bumps is to be probed, it is preferred for the probe array to have probes which are disposed diagonally with respect to the contact bump array, e.g., as shown on FIG. 5b. One probe of the array is referenced as 508. In the examples of FIGS. 5a-b, the contact bump spacing and the probe size are the same, while the probe separation is larger on FIG. 5b than on FIG. 5a as a result of the diagonal arrangement of the probes. Therefore, the contact pad separation can be substantially decreased on FIG. 5b compared to FIG. 5a (e.g., until the probe overlap on FIG. 5b is the same as on FIG. 5a). Thus, a diagonal arrangement of probes can provide probing of more densely spaced contact bump arrays than an orthogonal arrangement of probes, other parameters being equal. Angles other than 45 degrees can also be employed, depending on the contact bump layout, to enable probing of densely packed contact bumps.

Figure 6:
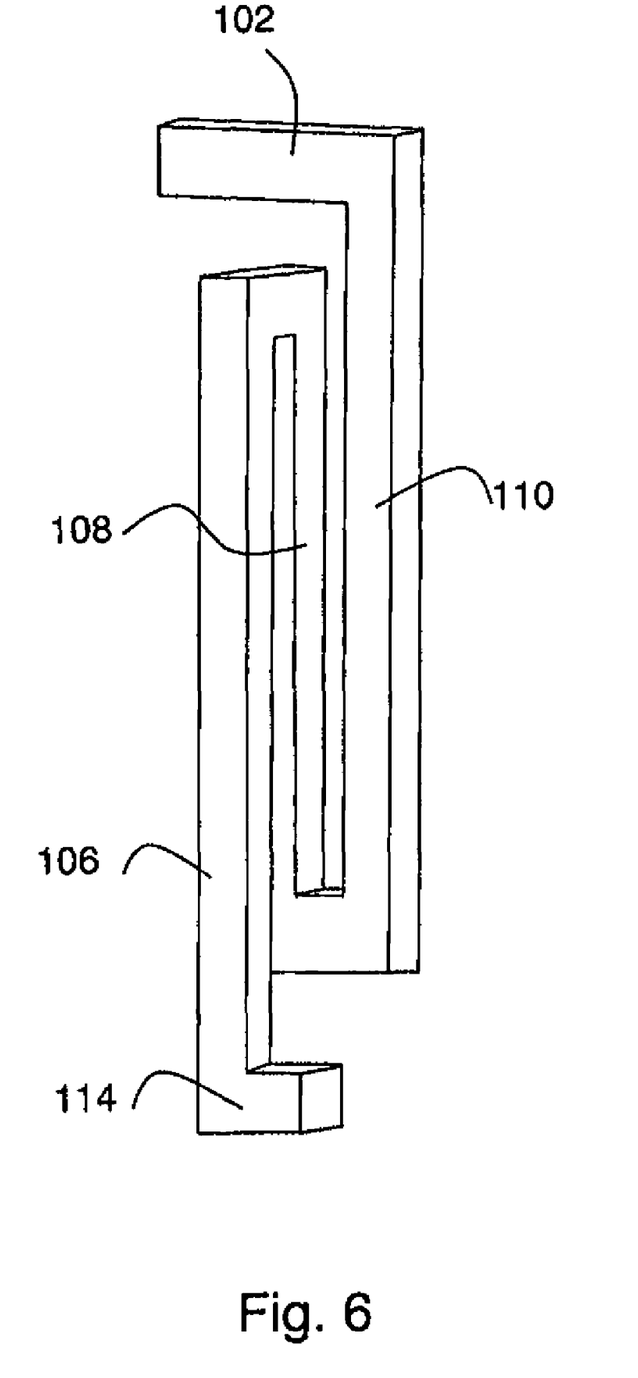
FIG. 6 shows a probe according to an embodiment of the invention having non-coplanar vertical arm portions.

FIG. 6 shows a probe according to an embodiment of the invention having non-coplanar vertical arm portions. More specifically, arm portions 106, 108, and 110 are not disposed in a common plane, in contrast with prior-described examples of the invention where arm portions 106, 108, and 110 are disposed in a common plane. Such an embodiment of the invention provides another approach for providing increased probe density for probing dense arrays of contact pads. The top view outline of the probe of FIG. 6 can be more square than rectangular, which can facilitate closer packing of the probes. The geometry of an apparatus in which the probes are used may affect the choice between planar and non-planar probes.

What is claimed is:

1. A probe for testing a device under test comprising:
   a base;
   a tip;
   an arm extending from said base to said tip, said arm comprising a plurality of vertical portions and a lateral termination; and
   at least two of said vertical portions contacting each other as contact is made between said probe and the device under test.

2. The probe of claim 1 wherein said vertical portions are substantially parallel to a scrub direction.

3. The probe of claim 2 wherein said scrub direction comprises a lateral scrub direction.

4. The probe of claim 1 wherein said vertical portions are laterally displaced from each other.

5. The probe of claim 1 wherein said vertical portions have a substantial vertical overlap with each other.

6. The probe of claim 1 wherein said tip is disposed on said lateral termination.

7. The probe of claim 1 wherein said tip comprises a reduced-width protrusion for making electrical contact.

8. The probe of claim 1 comprising three of said vertical portions.

9. The probe of claim 1 wherein said arm comprises a single continuous member.

10. The probe of claim 1 wherein said vertical portions provide a current path having a reduced inductance from said base to said tip.

11. The probe of claim 1 further comprising a clamping plate for mounting said probe.

12. The probe of claim 1 further comprising a fixture for mounting said probe.

13. The probe of claim 1 wherein said probe is disposed on a metalized pad.

14. The probe of claim 13 wherein said metalized pad is disposed on a carrier.

15. The probe of claim 14 further comprising a via that passes through said carrier and connects a first contact pad to a second contact pad.

16. The probe of claim 15 further comprising a space transformer disposed on said carrier.

17. The probe of claim 16 wherein said space transformer comprises solder bumps for connecting to said carrier.

18. The probe of claim 1 wherein said probe is disposed on a multiple probe array.

19. The probe of claim 18 wherein said array comprises multiple overlapping probes.

20. The probe of claim 19 wherein said overlapping probes are arranged orthogonally.

21. The probe of claim 19 wherein said overlapping probes are arranged diagonally.

22. The probe of claim 1 wherein said vertical portions are not disposed in a common plane.

23. The probe of claim 1 wherein said vertical portions are disposed in a common plane.

24. A probe for testing a device under test comprising:
   a base;
   a tip;
   an arm extending from said base to said tip, said arm comprising a plurality of vertical portions;
   at least two of said vertical portions contacting each other as contact is made between said probe and the device under test;
   a metalized pad, wherein said probe is disposed therein;
   a carrier, wherein said metalized pad is disposed therein; and
   a via that passes through said carrier and connects a first contact pad to a second contact pad.

25. The probe of claim 24 wherein said vertical portions are substantially parallel to a scrub direction.

26. The probe of claim 25 wherein said scrub direction comprises a lateral scrub direction.

27. The probe of claim 24 wherein said vertical portions are laterally displaced from each other.

28. The probe of claim 24 wherein said vertical portions have a substantial vertical overlap with each other.

29. The probe of claim 24 wherein said arm comprises a lateral termination.

30. The probe of claim 29 wherein said tip is disposed on said lateral termination.

31. The probe of claim 24 wherein said tip comprises a reduced-width protrusion for making electrical contact.

32. The probe of claim 24 comprising three of said vertical portions.

33. The probe of claim 24 wherein said arm comprises a single continuous member.

34. The probe of claim 24 wherein said vertical portions provide a current path having a reduced inductance from said base to said tip.

35. The probe of claim 24 further comprising a clamping plate for mounting said probe.

36. The probe of claim 24 further comprising a fixture for mounting said probe.

37. The probe of claim 24 further comprising a space transformer disposed on said carrier.

38. The probe of claim 37 wherein said space transformer comprises solder bumps for connecting to said carrier.

39. The probe of claim 24 wherein said probe is disposed on a multiple probe array.

40. The probe of claim 39 wherein said array comprises multiple overlapping probes.

41. The probe of claim 40 wherein said overlapping probes are arranged orthogonally.

42. The probe of claim 40 wherein said overlapping probes are arranged diagonally.

43. The probe of claim 24 wherein said vertical portions are not disposed in a common plane.

44. The probe of claim 24 wherein said vertical portions are disposed in a common plane.

45. A probe for testing a device under test comprising:
a base;
a tip;
an arm extending from said base to said tip, said arm comprising a plurality of vertical portions;
at least two of said vertical portions contacting each other as contact is made between said probe and the device under test; and
said vertical portions are not disposed in a common plane.

46. The probe of claim 45 wherein said vertical portions are substantially parallel to a scrub direction.

47. The probe of claim 46 wherein said scrub direction comprises a lateral scrub direction.

48. The probe of claim 45 wherein said vertical portions are laterally displaced from each other.

49. The probe of claim 45 wherein said vertical portions have a substantial vertical overlap with each other.

50. The probe of claim 45 wherein said arm comprises a lateral termination.

51. The probe of claim 50 wherein said tip is disposed on said lateral termination.

52. The probe of claim 45 wherein said tip comprises a reduced-width protrusion for making electrical contact.

53. The probe of claim 45 comprising three of said vertical portions.

54. The probe of claim 45 wherein said arm comprises a single continuous member.

55. The probe of claim 45 wherein said vertical portions provide a current path having a reduced inductance from said base to said tip.

56. The probe of claim 45 further comprising a clamping plate for mounting said probe.

57. The probe of claim 45 further comprising a fixture for mounting said probe.

58. The probe of claim 45 wherein said probe is disposed on a metalized pad.

59. The probe of claim 58 wherein said metalized pad is disposed on a carrier.

60. The probe of claim 59 further comprising a via that passes through said carrier and connects a first contact pad to a second contact pad.

61. The probe of claim 60 further comprising a space transformer disposed on said carrier.

62. The probe of claim 61 wherein said space transformer comprises solder bumps for connecting to said carrier.

63. The probe of claim 45 wherein said probe is disposed on a multiple probe array.

64. The probe of claim 63 wherein said array comprises multiple overlapping probes.

65. The probe of claim 64 wherein said overlapping probes are arranged orthogonally.

66. The probe of claim 64 wherein said overlapping probes are arranged diagonally.

* * * * *